United States Patent [19]
Matsumoto

[11] Patent Number: 6,132,498
[45] Date of Patent: Oct. 17, 2000

[54] SURFACE PROTECTING AGENT FOR LITHOGRAPHIC PRINTING PLATE

[75] Inventor: Hiroshi Matsumoto, Shizuoka, Japan

[73] Assignee: Fuji Photo Film Co., Ltd., Ashigara, Japan

[21] Appl. No.: 09/243,472

[22] Filed: Feb. 3, 1999

[30] Foreign Application Priority Data

Mar. 18, 1998 [JP] Japan .................. 10-067989

[51] Int. Cl.⁷ ............. C09D 5/00; C09K 3/00; B41N 3/03
[52] U.S. Cl. ............ 106/2; 106/287.23; 106/287.26; 106/243
[58] Field of Search ............. 106/2, 287.23, 106/287.26, 243

[56] References Cited

U.S. PATENT DOCUMENTS

| | | | |
|---|---|---|---|
| 4,253,999 | 3/1981 | Okishi | 106/2 |
| 4,268,613 | 5/1981 | Okishi | 430/309 |
| 4,291,117 | 9/1981 | Ohishi et al. | 430/309 |
| 4,348,954 | 9/1982 | Okishi | 101/465 |
| 4,680,251 | 7/1987 | Schober | 430/306 |
| 5,238,771 | 8/1993 | Goto et al. | 430/165 |

FOREIGN PATENT DOCUMENTS

| | | |
|---|---|---|
| 366020A2 | 5/1990 | European Pat. Off. . |
| 803778A1 | 10/1997 | European Pat. Off. . |
| 2925363A1 | 1/1980 | Germany . |

OTHER PUBLICATIONS

European Patent Abstract No. EP000638436A1, abstract of European Patent Specification No. 638436 (Feb. 1995).
Japanese Patent Abstract No. JP362009995A, abstract of Japanese Patent Specification No. 62–009995 (Jan. 1987.
Japanese Patent Abstract No. JP402022094A, abstract of Japanese Patent Specification No. 02–022094 (Jan. 1990).

*Primary Examiner*—Anthony Green
*Attorney, Agent, or Firm*—Burns, Doane, Swecker & Mathis, LLP

[57] ABSTRACT

An emulsion type surface protective agent for lithographic printing plate made up of an aqueous phase and an oil phase, wherein the oil phase contains at least one of the oxyethylene addition product of a fatty acid having from 12 to 30 carbon atoms and the oxyethylene addition product of the ester of a fatty acid having from 8 to 30 carbon atoms. The surface protective agent for lithographic printing plate has a high environmental safety, can desensitizing the non-imaging portions of a lithographic printing plate and does not cause blinding even when the surface protective agent is stored for a long period of time. Also, the surface protective agent for lithographic printing plate can be coated on a lithographic printing plate without need of water washing the printing plate after developing the printing plate by, e.g., an automatic processor.

4 Claims, No Drawings

SURFACE PROTECTING AGENT FOR LITHOGRAPHIC PRINTING PLATE

FIELD OF THE INVENTION

The present invention relates to a surface protective for lithographic printing plates.

BACKGROUND OF THE INVENTION

In plate-making a lithographic printing plate, a so-called gum solution was coated on the printing plate in the final step thereof.

The purpose of coating such a gum solution is not only for protecting the hydrophilic property of non-image regions of a lithographic printing plate but also for an image correction such as addition, deletion, etc., in image regions, a preservation of lithographic printing plate in the period of from making plate to printing or until reusing the printing plate, protection of a lithographic printing plate from the occurrence of stains and scratches caused by attachment of fingerprints, fats and oils, dusts, etc., in mounting the printing plate on a printing apparatus and during handling the printing plate, and further for restraining the occurrence of oxidation stains.

Hitherto, as a gum solution for a lithographic printing plate, an aqueous solution of gum arabic, a cellulose gum, or a water-soluble high molecular weight material having a carboxyl group in the molecule has been used. However, those gum liquids have had the following problems. That is, usually, in the final finishing step of a printing plate, a gum solution is poured on the printing plate, the gum solution is spread over the entire surface of the printing plate with a sponge, a cotton tampon, etc., and further the surface of the printing plate is rubbed with a wiping cloth until the surface of the plate is dried. In this case, the coating of the water-soluble high molecular weight material, etc., is partially thickened at the image region (ink-receptive region). The thick-coated image portion has a poor inking property at the step of printing and a considerable number of test prints is required until a print having a desired ink density is obtained. Generally, this phenomenon is called blinding (so-called poor inking, that is, a phenomenon that an ink does not attach to the portions of the printing plate to which an ink must be attached).

JP-A-55-19504 (the term "JP-A" as used herein means an "unexamined" published Japanese patent application) discloses an emulsion type surface protective agent for lithographic printing plate containing a plasticizer in an oil phase. However, a satisfactory inking property is not obtained.

On the other hand, recently, there is a tendency to consider that safety is important in the point of environment, and a surface protective agent for lithographic printing plate having a high safety has been desired. Also, it becomes an important theme to decrease the amount of a waste liquid and thus a plate making process wherein after developing, the surface protective agent for lithographic printing plate is coated on the printing plate without washing with water has become a main process. Under such circumstances, a novel surface protective agent for printing plate having a good coating property and a good durability and having imparted thereto a running aptitude has been desired. In particular, a development of a surface protective agent for lithographic printing plate having a high long stability to the contamination of developer components has been demanded.

SUMMARY OF THE INVENTION

Accordingly, one object of the present invention is to provide a surface protective agent for lithographic printing plate having a high environmental safety.

Another object of the present invention is to provide a surface protective agent for lithographic printing plate having a high safety, which desensitizes the non-imaging region of a lithographic printing plate and does not cause blinding when the lithographic printing plate coated with the surface protective agent is stored for a long period of time.

Still another object of the present invention is to provide a surface protective agent for lithographic printing plate, which can be easily applied on a printing plate even by using a sponge, a cotton tampon, an automatic gum coater, etc., and can be used for keeping a safety over a long period of time to the contamination of developer components in the embodiment that after developing by an automatic processor, the surface protective agent can be coated on the printing plate as it is without washing the printing plate with water.

As a result of various investigations for attaining the above-described objects, it has been found that in an emulsion type surface protective agent for lithographic printing plate, the above-described objects can be attained by using a specific emulsifier. The present invention has been accomplished based on this finding.

That is, according to the present invention, there is provided an emulsion type surface protective agent for lithographic printing plate, comprising an aqueous phase and an oil phase, wherein the oil phase contains at least one member selected from the group consisting of oxyethylene addition products of fatty acids having 12 to 30 carbon atoms and oxyethylene addition products of esters of fatty acids having 8 to 30 carbon atoms.

DETAILED DESCRIPTION OF THE INVENTION

The present invention is described in detail below.

The oxyethylene addition products of fatty acids having 12 to 30 carbon atoms used in the present invention specifically include esters of polyoxyethylene monofatty acids.

In the present invention, the fatty acids having 12 to 30 carbon atoms may be saturated fatty acids, or unsaturated fatty acids, and also may be fatty acids having hydroxyl groups. Examples of the fatty acid having 12 to 30 carbon atoms, and preferably 12 to 18 carbon atoms, include oleic acid, ricinoleic acid, peteroselinic acid, linolic acid, and linolenic acid. The addition number of the oxyethylene is about 3 to 60 mols, and the fatty acid is properly selected such that HLB becomes 3 to 18, and preferably 4 to 16.

The oxyethylene addition products of the esters of the fatty acids having 8 to 30 carbon atoms used in the present invention specifically include oxyethylene addition products of glycerol esters of the fatty acids having 8 to 30 carbon atoms, and preferably 12 to 18 carbon atoms.

In the present invention, the fatty acids having 8 to 30 carbon atoms may be saturated fatty acids, or unsaturated fatty acids, and also may be fatty acids having hydroxyl groups.

The oxyethylene addition products of the glycerol esters of such fatty acids specifically include a polyoxyethylene-added castor oil, a polyoxyethylene-added soybean oil, a polyoxyethylene-added tung oil, a polyoxyethylene-added sesame oil, a polyoxyethylene-added linseed oil, a polyoxyethylene-added coconut oil, a polyoxyethylene-added palm oil, a polyoxyethylene-added rice bran oil, and the like. Oxyethylene addition products of a hardened oil obtained by hydrogenating a castor oil can also be used.

In those oxyethylene addition products, the polyoxyethylene-added castor oil and the polyoxyethylene-added soybean oil are preferred, and the polyoxyethylene-added castor oil is particularly preferably used.

The addition number of the oxyethylene is about 3 to 60 mols, and they are properly selected such that HLB becomes 3 to 18, and preferably 4 to 16.

The above-described polyoxyethylene-added vegetable oils are commercially available. For example, there are Nikkol CO-3 to Nikkol CO-60T and Nikkol HCO-5 to HCO-100 (trade names of polyoxyethylene-added castor oils, made by Nikko Chemicals K.K.) and Pionin D-218N (trade name of a polyoxyethylene-added soybean oil, made by Takemoto Yusi K.K.).

The above-described compounds do not adversely affect the non-image regions of a lithographic printing plate, and give the property of improving the inking property to the image regions of a lithographic printing plate, and on the other hand, also have an ability as an emulsion-dispersing agent, higher than the level of conventional nonionic surface active agents. Particularly, the oxyethylene addition products of a castor oil and a soybean oil has the higher effect thereof In the surface protective agent for lithographic printing plate of the present invention, at least one member selected from the group consisting of the oxyethylene addition products of the fatty acids having 12 to 30 carbon atoms and the oxyethylene addition products of the esters of the fatty acids having 8 to 30 carbon atoms can be used. The content of the compound(s) in the surface protective agent for lithographic printing plate is generally 0.1 to 10% by weight, and preferably 0.3 to 7% by weight, based on the total weight of the surface protective agent for the printing plate. If the content thereof is less than 0.1% by weight, a stable emulsion is not obtained, and on the other, if the content exceeds 10% by weight, the product becomes disadvantageous in cost.

The surface protective agent for lithographic printing plate of the present invention may contain an emulsifier (surface active agent) in addition to the above-described compound(s).

For example, there are anionic surface agents and/or nonionic surface agents.

Examples of the anionic surface active agent include fatty acid salts, abietates, hydroxyalkanesulfonates, alkanesulfonate dialkylsulfosuccinates, straight-chain alkylbenzenesulfonates, branched alkylbenzenesulfonates, alkylnaphthalenesulfonates, alkylphenoxy polyoxyethylenepropylsulfonates, polyoxyethylene alkylsulfophenyl ether salts, N-methyl-N-oleyltaurine sodium salts, N-alkylsulfosuccinic acid monoamide di-sodium salts, petroleum sulfonates, a sulfated castor oil, a sulfated tallow oil, sulfuric acid ester salts of fatty acid alkyl esters, alkylsulfuric acid ester salts, polyoxyethylene alkylphenyl ether sulfuric acid ester salts, polyoxyethylene styrylphenyl ether sulfuric acid ester salts, alkylphosphoric acid ester salts, polyoxyethylene alkyl ether phosphoric acid ester salts, polyoxyethylene alkylphenyl ether phosphoric acid ester salts, the partial saponification products of a styrene-maleic anhydride copolymer, the partial saponification products of an olefin-maleic anhydride copolymer, and naphthalenesulfonate-formalin condensation products. In those anionic surface active agents, the dialkylsulfosuccinates, the alkylsulfuric acid ester salts, and the alkylnaphthalenesulfonates are particularly preferably used.

Examples of the nonionic surface active agent include polyoxyethylene alkyl ethers, polyoxyethylene alkylphenyl ethers, a polyoxyethylene polystyryl phenyl ether, a polyoxyethylene polyoxypropylene alkyl ether, glycerol fatty acid partial esters, sorbitan fatty acid partial esters, pentaerythritol fatty acid partial esters, a propylene glycol mono-fatty acid ester, polyoxyethylenesorbitan fatty acid partial esters, polyoxyethylenesorbitol fatty acid partial esters, polyethylene glycol fatty acid esters, polyglycerol fatty acid partial esters, polyoxyethylene glycerol fatty acid esters, fatty acid ethanolamides, N,N-bis-2-hydroxyalkylamines, polyoxyethylene alkylamine, a triethanolamine fatty acid ester, and a trialkylamine oxide. In those compounds, polyoxyethylene alkylphenyl ethers, polyoxyethylene polyoxypropylene block polymers are preferably used.

The oxyethylene addition products of acetylene glycol-based compounds and acetylene alcohol-based compounds, and fluorine-based and silicon-based anionic and nonionic surface active agents can also be similarly used.

These surface active agents can be used alone or as a combination of two or more kinds thereof. For example, two or more kinds of different anionic surface agents, and a combination of the anionic surface active agent and the nonionic surface active agent are preferably used.

There is no particular limitation on the amount of the above-described surface active agent(s) used, but the amount thereof is preferably 0.01 to 20% by weight base on the total weight of the surface protective agent for the printing plate.

The components constituting the aqueous phase of the surface protective agent of the lithographic printing plate of the present invention are:

(a) a water-soluble high molecular weight compound,
(b) an inorganic acid and/or an organic acid and the salt thereof,
(c) a wetting agent,
(d) an antiseptic, and
(e) if necessary, (1) a nitrate or a sulfate, (2) a chelating compound, and (3) a defoaming agent.

Examples of the water-soluble high molecular weight compound as the aqueous phase component (a) in the present invention include gum arabic, dextrin, denatured starch, cellulose derivatives (e.g., carboxymethyl cellulose, carboxyethyl cellulose, and methyl cellulose) and the modified products thereof, prulan, polyvinyl alcohol and the derivatives thereof, polyvinyl pyrrolidone, polyacrylamide and the copolymers thereof, a vinyl methyl ether/maleic anhydride copolymer, a vinyl acetate/maleic anhydride copolymer, a styrene/maleic anhydride copolymer, and soybean polysaccharides. In these compounds, gum arabic, dextrin, denatured starch, carboxymethyl cellulose, soybean polysaccharides, etc., can be preferably used.

In the present invention, the above-described compounds can be used alone or as a combination of two or more kinds thereof. The content of the compound(s) is generally 0.1 to 50% by weight, and preferably 0.3 to 30% by weight, based on the total weight of the surface protective agent of the lithographic printing plate.

Because it is advantageous to use the surface protective agent of the lithographic printing plate of the present invention in an acid range of the pH of 2.5 to 5, the inorganic acid and/or the organic acid or the salt thereof as the component (b) is used for adjusting the pH to the range of 2.5 to 5, and generally, a mineral acid, an organic acid, or an organic salt is used. The addition amount thereof is 0.01 to 3% by weight based on the weight of the surface protective agent of the lithographic printing plate.

Examples of the mineral acid include nitric acid, sulfuric acid, phosphoric acid, and metaphosphoric acid. Examples of the organic acid include citric acid, acetic acid, oxalic acid, malonic acid, p-toluenesulfonic acid, tartaric acid, malic acid, lactic acid, levulinic acid, phytic acid, and organic phosphonic acid. Examples of the inorganic salt include sodium primary phosphate, sodium secondary phosphate, sodium hexametaphosphate, and sodium tripolyphosphate. At least one kind of each of the mineral acids, the organic acids, and the organic salts may be used together.

Examples of the wetting agent as the component (c) include ethylene glycol, propylene glycol, triethylene glycol, butylene glycol, hexylene glycol, diethylene glycol, dipropylene glycol, glycerol, trimethylolpropane, and diglycerol. These wetting agents-may be used alone or as a combination of two or more kinds thereof. The amount of the wetting agent used is generally 0.1 to 5% by weight based on the total weight of the surface protective agent for lithographic printing plate.

Examples of the antiseptic as the component (d), which can be preferably used in the present invention, include phenol and the derivatives thereof, formalin, imidazole derivatives, sodium dehydroacetate, 4-isothiazolin-3-one derivatives, benzoisothiazolin-3-one, benztriazole derivatives, amidine-guanidine derivatives, tertiary ammonium salts, pyridine derivatives, quinoline derivatives, guanidine derivatives, diazine, triazole derivatives, oxazole, oxazine derivatives, nitrobromoalcohol-based 2-bromo-2-nitropropane-1,3-diol, 1,1-dibromo-1-nitro-2-ethanol, and 1,1-dibromo-1-nitro-propanol.

The preferred addition amount thereof is an amount stably showing the effect to bacterium, molds, yeasts, etc. Although the amount varies depending on the kinds of the bacteria, the mold, the yeast, etc., the amount is preferably in the range of from 0.01 to 4% by weight based on weight of the surface protective agent for lithographic printing plate. Also, it is preferred to use two or more kinds of antiseptics such that they show an effect to various molds and bacteria.

Examples of the nitrate and the sulfate as the component (e)(1) include magnesium nitrate, sodium nitrate, potassium nitrate, ammonium nitrate, sodium sulfate, potassium sulfate, ammonium sulfate, sodium hydrogensulfate, and nickel sulfate.

The surface protective agent for lithographic printing plate is usually commercially available as the concentrated liquid for an economical reasons and at use, is diluted by adding thereto tap water, well water, etc. Because a calcium ion, etc., in the tap water, the well water, etc., used for diluting the concentrated liquid adversely affect printing, which may become the cause of staining the prints, the above-described fault can be solved by adding the chelating agent as the component (e) (2) to the diluted liquid. Preferred examples of the chelating agent include organic phosphonic acids and phosphonoalkanetricarboxylic acids, such as ethylene-diaminetetraacetic acid and the potassium salt and the sodium salt thereof; diethylenetriaminepentaacetic acid and the potassium salt and the sodium salt thereof; triethylene-tetraminehexaacetic acid and the potassium salt and the sodium salt thereof; triethylenetetraminehexaacetic acid and the potassium salt and the sodium salt thereof; hydroxy-ethylethylenediaminetriacetic acid and the potassium salt and the sodium salt thereof; nitrilotriacetic acid and the sodium salt thereof; 1-hydroxyethane-1,1-diphosphonic acid and the potassium salt and the sodium salt thereof; aminotri-(methylenesulfonic acid) and the potassium salt and the sodium salt thereof; etc. In the above-described compounds, the chelating compound which stably exists in the composition of the surface protective agent for lithographic printing plate and does not obstruct the printing property is selected. The addition amount thereof is suitably 0.001 to 1.0% by weight based the weight of the surface protective agent for lithographic printing plate at use.

The defoaming agent as the component (e) (3) which can be used includes general silicon-based defoaming agents, surface active agent type defoaming agents, emulsion-dispersing type defoaming agents, water-solubilizing type defoaming agents, etc. The amount of the defoaming agent used is 0.001 to 10% by weight based the weight of the surface protective agent for lithographic printing plate.

The components constituting the oil phase of the surface protective agent for lithographic printing plate of the present invention are:

(f) an organic solvent having a solubility in water at 20° C. of 5% by weight or less and a boiling point of at least 160° C., and (g) the above-described emulsifier.

Preferred examples of the organic solvent having a solubility in water at 20° C. of 5% by weight or less and a boiling point of at least 160° C. as the component (f) for the oil phase in the present invention include plasticizers having a freezing point of 15° C. or less and a boiling point under 1 atmosphere of at least 300° C., and the examples thereof include phthalic acid diesters such as butyl phthalate, diheptyl phthalate, di-n-octyl phthalate, di(2-ethylhexyl) phthalate, dinonyl phthalate, didecyl phthalate, dilauryl phthalate, butylbenzyl phthalate, etc.; aliphatic dibasic acid esters such as dioctyl adipate, butyl glycol adipate, dioctyl azerate, dibutyl sebacate, di(2-ethylhexyl) sebacate, dioctyl sebacate, etc.; epoxidated triglycerides such as an epoxidated soybean oil, etc.; phosphoric acid esters such as tricresyl phosphate, trioctyl phosphate, trichloroethyl phosphate, etc.; and benzoic acid esters such as benzyl benzoate, etc.

Other organic solvents which can be used are alcohol-based solvents and glycol-based solvents.

Examples of the alcohol-based solvent include 2-octanol, 2-ethylhexanol, nonanol, n-decanol, undecanol, n-dodecanol, trimethylnonyl alcohol, tetradecanol, and benzyl alcohol.

Examples of the glycol-based solvent include ethylene glycol isoamyl ether, ethylene glycol monophenyl ether, ethylene glycol benzyl ether, ethylene glycol hexyl ether, and octylene glycol.

The amount of the organic solvent used is in the range of from 0.1 to 5% by weight, and preferably from 0.5 to 3% by weight, based on the weight of the surface protective agent for lithographic printing plate.

The organic solvents can be used alone or as a mixture of two or more kinds thereof.

For the emulsification dispersion in producing the surface protective agent for lithographic printing plate of the present invention, the temperature of the aqueous phase is adjusted to 40° C.±5° C., the aqueous phase is stirred at a high speed, and after slowly adding dropwise the prepared oil phase to the aqueous phase followed by sufficiently stirring, the mixture is passed through a pressure-type homogenizer to prepare an emulsion.

The surface protective agent for lithographic printing plate of the present invention can be used for both a positive-working lithographic printing plate and a negative-working lithographic printing plate. Also, the surface protective agent for lithographic printing plate can be uniformly coated using an automatic gum applying means. The treatment with the surface protective agent for lithographic printing plate of the present invention can be immediately carried out without applying water washing after a development treatment step or can be carried out after a development treatment (including a water washing step, a running water circulating washing step, or a washing step of coating a small amount of water) or after treating with a rinse solution containing a surface active agent.

The surface protective agent for lithographic printing plate of the present invention shows excellent effects for the protection of the ink-receptive property of the image portions and for the protection of the hydrophilic property of the non-image portions.

Also, in the present invention, for example, a polyoxyethylene-added vegetable oil having a high environmental safety is used as the emulsifier of the surface protective agent. The surface protective agent has a high emulsified stability, so that even when the surface protective agent is stored for a long period of time, the emulsified stability does not deteriorate, thus showing a high printing plate protective property of the image portions. Furthermore, even when a developer contaminates, the surface protective agent keeps the emulsified stability and is excellent in the running aptitude.

Specifically, in the case of applying the surface protective agent for lithographic printing plate of the present invention, the inking property of the image portions of the plating plate is good, whereby color matching of a print can be carried out in a short time, and directly after initiating printing, sufficiently clear prints can be obtained without printing many inferior prints. This is considered to be that by the surface protective agent for lithographic printing plate of the present invention, the oily component in an ink permeates into the image portions and, as a result, the inking property of the image portions is accelerated. Also, the printing plate to which the surface protective agent for lithographic printing plate of the present invention was applied shows a good inking property after storing.

The present invention is described in more detail by the following examples. Unless otherwise indicated, app parts and percents are by weight.

EXAMPLE 1

[Preparation of Aqueous Phase]

After dissolving 80 parts of gum arabic and 170 parts of cream dextrin in 656.7 parts of pure water, the resulting solution was cooled to 40° C. Thereafter, 10 parts of ammonium primary phosphate, 3 parts of phosphoric acid (85%), and 20 parts of glycerol were dissolved in the solution, and 0.3 parts of Biohope (i.e., an isothiazoline-based compound/nitrobromo alcohol-based compound containing material) as an antiseptic was added to the solution to prepare an aqueous phase.

[Preparation of Oil Phase]

To 15 parts of dibutyl sebacate were added 5 parts of benzyl alcohol, 12 parts of sodium alkylbenzenesulfonate (40% aqueous solution, soft type), 10 parts of an oxyethylene addition product of a castor oil (HLB 7.2), and sodium dialkylsulfosuccinate (80%), and the resulting mixture was stirred until a homogeneous solution was obtained.

[Emulsion-dispersion]

The temperature of the aqueous phase prepared above was adjusted to 40° C. and while stirring the aqueous phase by a three-one motor at a stirring speed of from 500 to 600 rpm, the oil phase prepared above was added dropwise thereto. After completion of the addition, the resulting mixture was further stirred for 10 minutes. Thereafter, the mixture was emulsified using a pressure-type homogenizer to prepare a surface protective agent for lithographic printing plate. The surface protective agent for lithographic printing plate was diluted with water at 1:1 for use.

COMPARATIVE EXAMPLES 1 AND 2

As comparative examples, a solution type surface protective agent for lithographic printing plate (Comparative Example 1) and an emulsion type surface protective agent for lithographic printing plate (Comparative Example 2) were prepared by the following compositions shown in Table 1 below and they were also diluted with water at 1:1 for use. In addition, the composition of the surface protective agent for lithographic printing plate of Example 1 above is shown together in the table.

TABLE 1

| | | | (parts by weight) |
| | | Example | Comparative Example |
| Composition | | 1 | 1 | 2 |
| --- | --- | --- | --- | --- |
| [Aqueous Phase] | | | | |
| Pure water | | 656.7 | 709.7 | 681.7 |
| Gum arabic | | 80 | 80 | 80 |
| Cream dextrin | | 170 | 170 | 170 |
| Ammonium phosphate | | 10 | 10 | 10 |
| Phosphoric acid (80%) | | 3 | 3 | 3 |
| Glycerol | | 20 | 20 | 20 |
| Biohole (antiseptic) | | 0.3 | 0.3 | 0.3 |
| [Oil Phase] | | | | |
| Dibutyl sebacate | | 15 | — | 15 |
| Benzyl alcohol | | 5 | — | — |
| Sodium alkylbenzene-Sulfonate (40%) | | 12 | 5 | 12 |
| Castor oil-oxy-ethylene adduct (HLB 7.2) | | 10 | — | — |
| Polyoxyethylene nonyl phenyl ether (HLB 7.8) | | — | — | 10 |
| Sodium dialkyl-succinate (80%) | | 18 | 2 | 18 |

AS each lithographic printing plate, an anodized multi-grain type positive-working PS plate (VPS, trade name, manufactured by Fuji Photo Film Co., Ltd.) was image-exposed, developed by a PS automatic processor 900 D (having the function to coat a gum after development), and was coated with each of the above-described surface protective agents for lithographic printing plate.

Each lithographic printing plate after completion of the plate-making was split into two portions, and after storing each portion under each of the conditions shown in Table 2, printing was carried out using a Heidelberg SORM printing machine, and the performance was evaluated by the performance evaluation method shown in Table 3. The results are shown in Table 4.

TABLE 2

| Storage Condition |
| --- |
| A: In a room, 22° C. to 25° C., 24 hours |
| B: Forcible storage: 45° C./80% RH, 24 hours |

TABLE 3

| Item | Test Condition and Method |
|---|---|
| 1. Inking property | The number of the printed papers until a normal print is obtained by completely attaching an ink to the image portions from the initiation of printing. |
| 2. Oil and fat staining | By dropping 50 μl of a liquid composed of 1 g of oleic acid and 50 g of xylene onto the non-image portion, the stain of the non-image portion was determined. |

TABLE 4

| | Storage Condition | | | | | |
|---|---|---|---|---|---|---|
| | Example 1 | | Comparative Example 1 | | Comparative Example 2 | |
| Item | A | B | A | B | A | B |
| Inking property | 7~10 | 10~14 | 40~50 | >300 | 18~23 | 70~80 |
| Oil and fat stain | ○ | ○ | Δ | Δ | ○ | ○ |

○: Good
Δ: Slightly poor
x: Poor

As shown in Table 4, the sample of Example 1 was excellent as the surface protective agent for lithographic printing plate in all the items as compared with the samples of Comparative Examples 1 and 2.

EXAMPLES 2 TO 4

Surface protective agents for lithographic printing plate were prepared using the compositions shown in Table 5 below in the same manner as in Example 1. Printing tests were carried out in the same manner as in Example 1. Regarding the emulsified stability, the appearance after storing in a room (23° C., 72 hours) and after freezing and thawing (-15° C., frozen for 72 hours) was observed. The results are shown in Table 6.

TABLE 5

| | Example | | |
|---|---|---|---|
| | 2 | 3 | 4 |
| [Aqueous phase] | | | |
| Pure water | 657.7 | 637.7 | 660.6 |
| Gum arabic | — | 40 | — |
| Soybean polysaccharides | 60 | — | 40 |
| Carboxymethyl cellulose | — | 40 | 20 |
| Cream dextrin | 95 | 40 | — |
| Enzyme-decomposed dextrin | 95 | 150 | 180 |
| Ammonium phosphate | 10 | 5 | — |
| Hexametaphosphoric acid | — | 5 | 10 |
| Phosphoric acid (85%) | 3 | 3 | — |
| Citric acid | — | — | 5 |
| Ethylene glycol | 20 | — | 10 |
| Glycerol | — | 20 | 10 |
| Proxel GXL (antiseptic) | 0.3 | — | 0.2 |
| Biohope (antiseptic) | — | 0.3 | 0.2 |
| [Oil phase] | | | |
| Dibutyl sebacate | 10 | — | 5 |
| Dioctyl phthalate | — | 15 | 10 |
| Benzyl alcohol | — | 5 | 10 |
| Octylene glycol | 10 | — | — |
| Sodium alkylbenzenesulfonate (40%) | 12 | 12 | 12 |

TABLE 5-continued

| | Example | | |
|---|---|---|---|
| | 2 | 3 | 4 |
| Castor oil-oxyethylene Adduct (HLB 7.2) | 8 | 5 | — |
| Castor oil-oxyethylene adduct (HLB 14) | — | 5 | — |
| Hardened castor oil-oxyethylene adduct | — | — | 10 |
| Soybean oil-oxyethylene Adduct | 2 | — | — |
| Sodium dialkylsulfosuccinate (80%) | 17 | 17 | 17 |

TABLE 6

| | Storage Condition | | | | | |
|---|---|---|---|---|---|---|
| | Example 2 | | Example 3 | | Example 4 | |
| Item | A | B | A | B | A | B |
| Inking property (Number of prints) | 7~10 | 10~13 | 7~10 | 10~13 | 7~10 | 12~15 |
| Oil and fat stain | ○ | ○ | ○ | ○ | ○ | ○ |
| Emulsified Stability | | | | | | |
| In a room | ○ | | ○ | | ○ | |
| Freezing and thawing | ○ | | ○ | | ○ | |

○: good
Δ: slightly inferior
x: inferior

As shown in Table 6, the surface protective agents for lithographic printing plate of Examples 2 to 4 show the good results in all the evaluation tests.

While the invention has been described in detail and with reference to specific embodiments thereof, it will be apparent to one skilled in the art that various changes and modifications can be made therein without departing from the spirit and scope thereof.

What is claimed is:

1. An emulsion surface protective agent for lithographic printing plate, comprising an aqueous phase and an oil phase, wherein the oil phase contains at least one member in an amount of at least 0.1% by weight of the surface protective agent selected from the group consisting of oxyethylene addition products of fatty acids having 12 to 30 carbon atoms and oxyethylene addition products of esters of fatty acids having 8 to 30 carbon atoms.

2. The surface protective agent as claimed in claim 1, wherein the oxyethylene addition products of fatty acids having 12 to 30 carbon atoms are esters of polypropylene monofatty acids.

3. The surface protective agent as claimed in claim 1, wherein the oxyethylene addition products of esters of fatty acids having 8 to 30 carbon atoms are oxyethylene addition adducts of glycerol esters of fatty acids having 8 to 30 carbon atoms.

4. The surface protective agent as claimed in claim 1, wherein the oxyethylene addition products are contained in an amount of 0.1 to 10 % by weight based on the total weight of the surface protective agent.

* * * * *